(12) United States Patent
Huang

(10) Patent No.: US 7,954,232 B2
(45) Date of Patent: Jun. 7, 2011

(54) CRIMPING TOOL WITH DETACHABLE CABLE CONNECTOR TESTER

(75) Inventor: Hobbes Huang, Taipei (TW)

(73) Assignee: Hobbes & Co., Ltd., Hsi Chih (TW)

( * ) Notice: Subject to any disclaimer, the term of this patent is extended or adjusted under 35 U.S.C. 154(b) by 262 days.

(21) Appl. No.: 12/430,501

(22) Filed: Apr. 27, 2009

(65) Prior Publication Data

US 2010/0269329 A1    Oct. 28, 2010

(51) Int. Cl.
*B23P 21/00* (2006.01)
(52) U.S. Cl. .......................................................... 29/720
(58) Field of Classification Search .................... 29/720, 29/751, 715, 717, 718, 721, 750, 753; 72/409.14; 379/21; 324/142
See application file for complete search history.

(56) References Cited

U.S. PATENT DOCUMENTS

| | | | |
|---|---|---|---|
| 6,091,237 A * | 7/2000 | Chen | 324/142 |
| 6,351,865 B1 * | 3/2002 | De Donato | 7/107 |
| 6,836,536 B2 * | 12/2004 | Huang | 379/21 |

* cited by examiner

*Primary Examiner* — John C Hong
(74) *Attorney, Agent, or Firm* — C. G. Mersereau; Nikolai & Mersereau, P.A.

(57) ABSTRACT

A crimping tool with detachable cable connector tester includes a crimper body for crimping a signal connector to a cable, two pressing handles, and at least one cable connector tester. Therein, the two pressing handles are movably connected with the crimper body and have at least one fastening groove, the cable connector tester is detachably set in the fastening groove, and thereby construction workers can use the crimping tool to crimp the signal connector with the cable. After crimping, the signal connector can be inserted into the cable connector tester that is selectively attached with the crimping tool, so as to test the conduction between the signal connector and the cable.

9 Claims, 4 Drawing Sheets

CRIMPING TOOL WITH DETACHABLE CABLE CONNECTOR TESTER

BACKGROUND OF THE INVENTION

1. Field of the Invention

The present invention relates to a crimping tool, in particular to an improved crimping tool with detachable cable connector tester, which can facilitate the crimping and inspecting between a signal connector and a cable.

2. Description of Related Art

While on site for an internet cable construction, the conditions can be unpredictable, therefore construction workers must prepare various tools, such as a crimping tool or a cable connector tester, and other materials, such as cables, cable plugs, or sockets, so that construction workers can deal with various possible situations when undergoing with works related to inspecting or connecting of internet cables.

During the process of construction, such as when workers are connecting internet cable lines on the construction site, cable length often needs to be varied so as to adapt the dimensions of the cable construction site. The cable length modification process is done by cutting a connector at one end of the cable, measuring the cable length required, and then connecting a new connector to the end of the cable, so as to conform to the dimensions requirements of the cable construction site.

However, construction workers may come upon problems in the cable construction site. The description of the problems is as follows. Construction workers always accommodate tools (crimping tool or cable connector tester) and the materials (cables, cable plugs, or sockets) in a tool box for ease of portability. However since the construction works must move constantly to deal with on-site construction states, a tool box itself can be cumbersome. Specifically speaking, when the construction workers finish with one end of the cable, they then move to the other end of the cable so as to complete the work on this cable. Therein, once the connecting of the cable with a connector is complete, the cable then further needs to have a conduction test done by a cable connector tester. For the above reason, if the construction workers must always take the tool box and travel from end to end for all the cables, then it is inconvenient and makes a simple thing job become unnecessarily complicated and labor intensive.

Therefore, it is necessary to design an improved crimping tool to overcome the above-mentioned problems.

SUMMARY OF THE INVENTION

The primary object of the present invention is to provide an improved crimping tool with detachable cable connector tester that is convenient for users, and the users may only need to take the fewest number of tools necessary, yet still be able to deal with the basic problems and conditions while working with cables.

The second object of the present invention is to provide an improved crimping tool with detachable cable connector tester that has at least one cable connector tester free to be attached or detached by the users according to the construction requirements, so that users can use and carry the cable connector tester anytime with ease. Thereby the present invention increases the convenience of network construction.

In order to achieve the above object, the present invention provides a crimping tool with detachable cable connector tester, which includes a crimper body and two pressing handles. One end of each pressing handle is movably connected to the crimper body. The other end of each pressing handle has at least one fastening groove, wherein the two pressing handles are pressed to drive the crimper body to crimp a signal connector with a cable. At least one cable connector tester is detachably disposed in the fastening groove. After the signal connector is crimped with the cable, the signal connector can then be inserted into the cable connector tester for testing the conduction between the signal connector and the cable.

The present invention has advantageous features as follows. The crimping tool has crimping and inspecting function for on-site network construction works, and thereby lines distribution (wiring) works may proceed quickly. Furthermore, the on-site construction works can detach the cable connector tester from the crimping tool, or otherwise attach the cable connector tester on the crimping tool, so that the workers may only need to take the fewest number of tools necessary, but still be able to crimp and inspect the signal connector and the cable. The end result is an increase with the convenience of construction.

For further understanding of the present invention, reference is made to the following detailed description illustrating the embodiments and examples of the present invention. The description is for illustrative purpose only and is not intended to limit the scope of the claim.

BRIEF DESCRIPTION OF THE DRAWINGS

The drawings included herein provide a further understanding of the present invention. A brief introduction of the drawings is as follows.

DETAILED DESCRIPTION OF THE PREFERRED EMBODIMENTS

Figure 1:
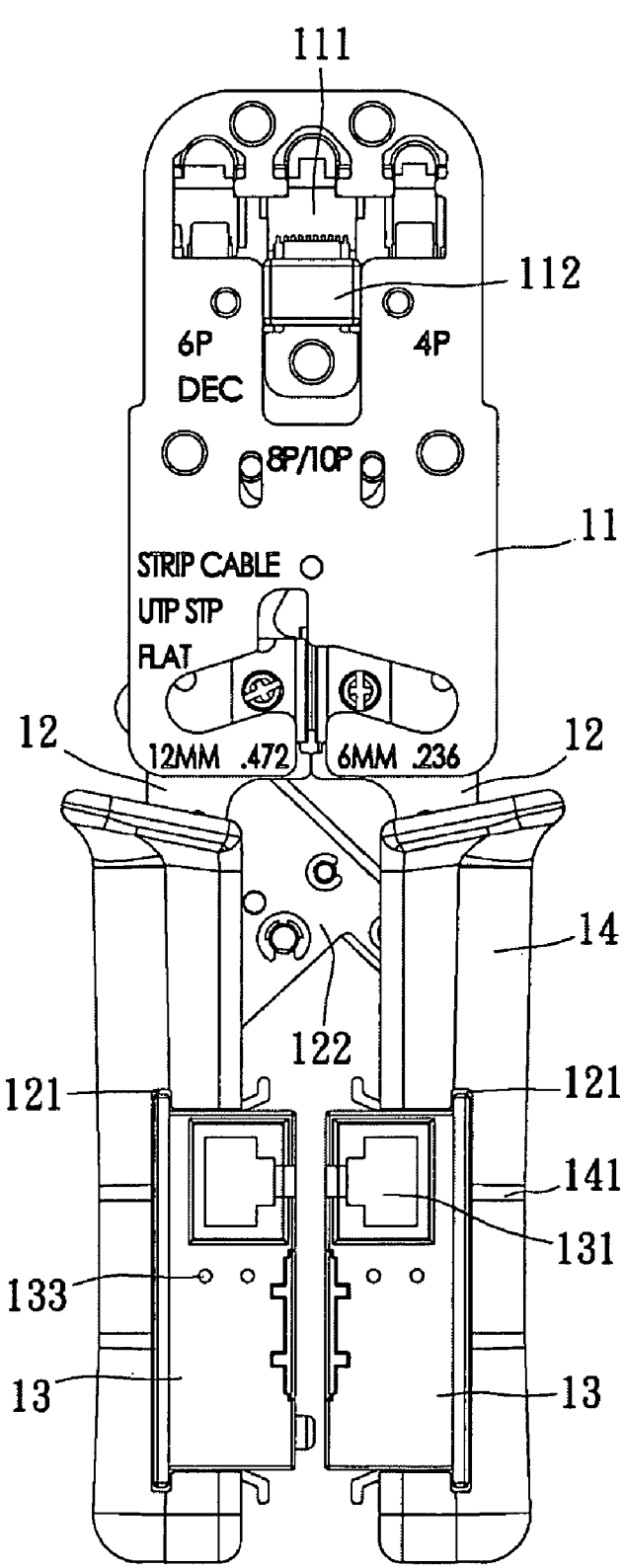
FIG. 1 is a schematic view showing a crimping tool of the present invention.
Figure 2:
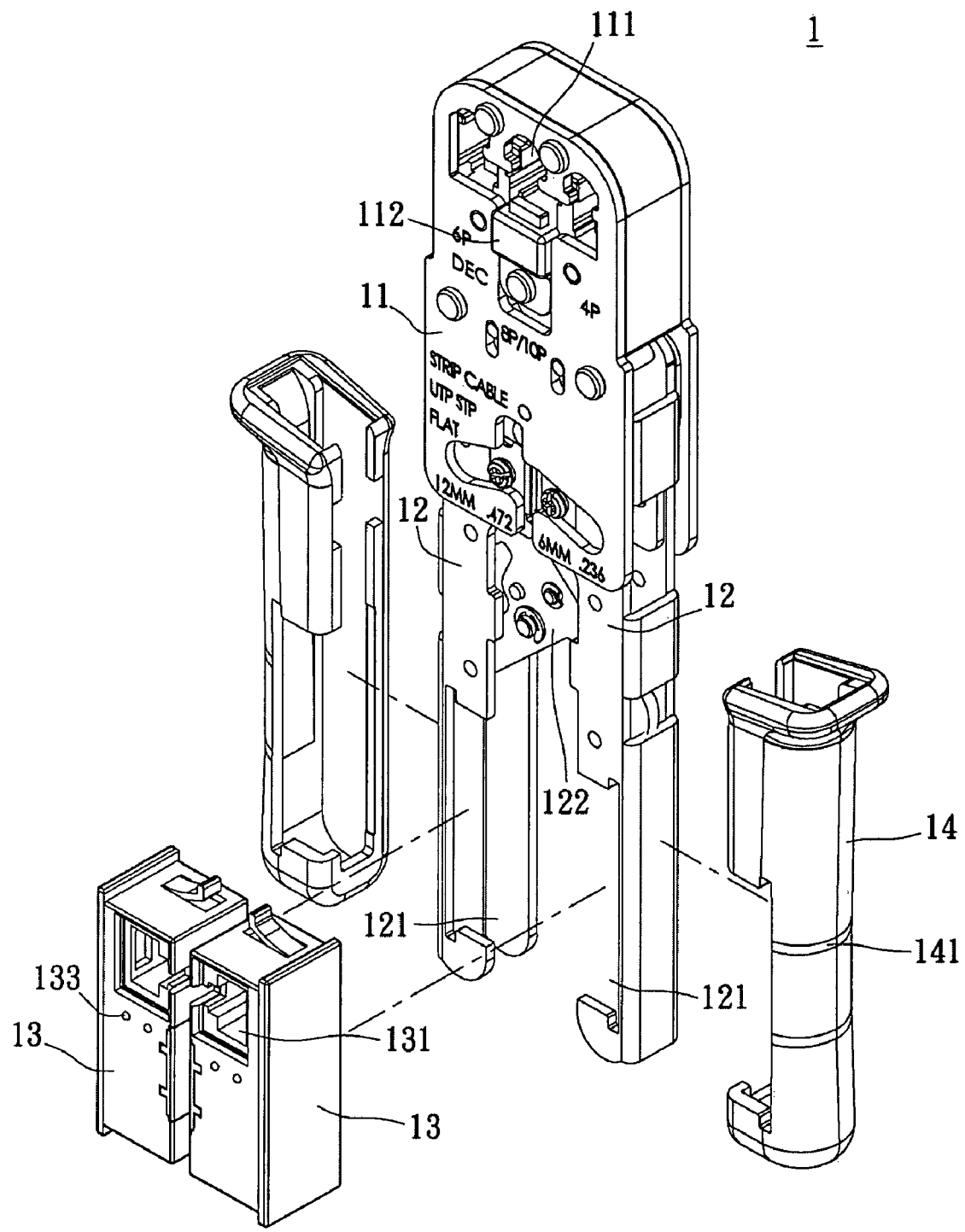
FIG. 2 is an exploded perspective view showing the crimping tool of the present invention.

Please refer to FIG. 1 and FIG. 2, the present invention provide a crimping tool with detachable cable connector tester. The crimping tool 1 includes a crimper body 11, two pressing handles 12, and two cable connector testers 13. Therein one end of each pressing handle 12 is connected to the crimper body 11, and each cable connector tester 13 is disposed on the other end of each pressing handle 12.

The crimper body 11 has at least one crimping groove 111 and at least one crimping element 112. The crimping groove 111 is concavely located on the crimper body 11. The crimping element 112 is movably disposed in the crimping groove 111 for crimping. As a result, a signal connector 2 can be crimped with a cable 3 by the crimping element 112 and the crimping groove 111 (please refer to FIG. 4); thereby the signal connector 2 is electrically connected with the cable 3. Furthermore, that the number of the crimping groove 111 is not limited to the present embodiment; wherein the number can be one, two, three, or a plurality as according to user's requirement. In the present embodiment, there are three crimping grooves 111.

One end of each pressing handle 12 is movably disposed in the crimper body 11 and can press against the crimping element 112. When users press the two pressing handles 12, the end of each pressing handle 12 push against the crimping element 112 in the crimping groove 111, so that the crimping element 112 is pushed to move and crimp the signal connector 2 which is placed in the crimping groove 111 with the cable 3, thereby the signal connector 2 and the cable 3 may achieve electrical connection.

Furthermore, the other end of each pressing handle 12 has a fastening groove 121. The two cable connector testers 13 are detachably set in the two fastening grooves 121, thereby when the two cable connector testers 13 are not used, users can detach the two cable connector testers 13 for storage.

In order to make the two pressing handles 12 return to an original position for users to press again, an elastic retaining element 122 is elastically retained between the two pressing handles 12 so that the two pressing handles 12 may open at a predetermined angle. Alter users press the two pressing handles 12 to crimp the signal connector 2 and the cable 3, users then release the two pressing handles 12, and subsequently the elastic retaining element 122 restores and retains the two pressing handles 12 to the original position and so that the two pressing handles 12 form the predetermined angle.

In order to prevent the users from over exertion and causing the crimping tool 1 to slip out of the users' hand, the two pressing handles 12 can further be covered with two non-skid cushions 14. The two non-skid cushions 14 can strengthen the friction between users' hand and the two pressing handles 12 so as to prevent the crimping tool 1 from slipping out of the users' hand. Additionally, the two pressing handles 12 further has a plurality of non-skid patterns 141, wherein the non-skid patterns 141 are notched or protruded on the two non-skid cushion 14. The non-skid patterns 141 can strengthen the friction between the users' hand, and thereby the non-skid cushion 14 improves the non-skid effect.

Figure 3:
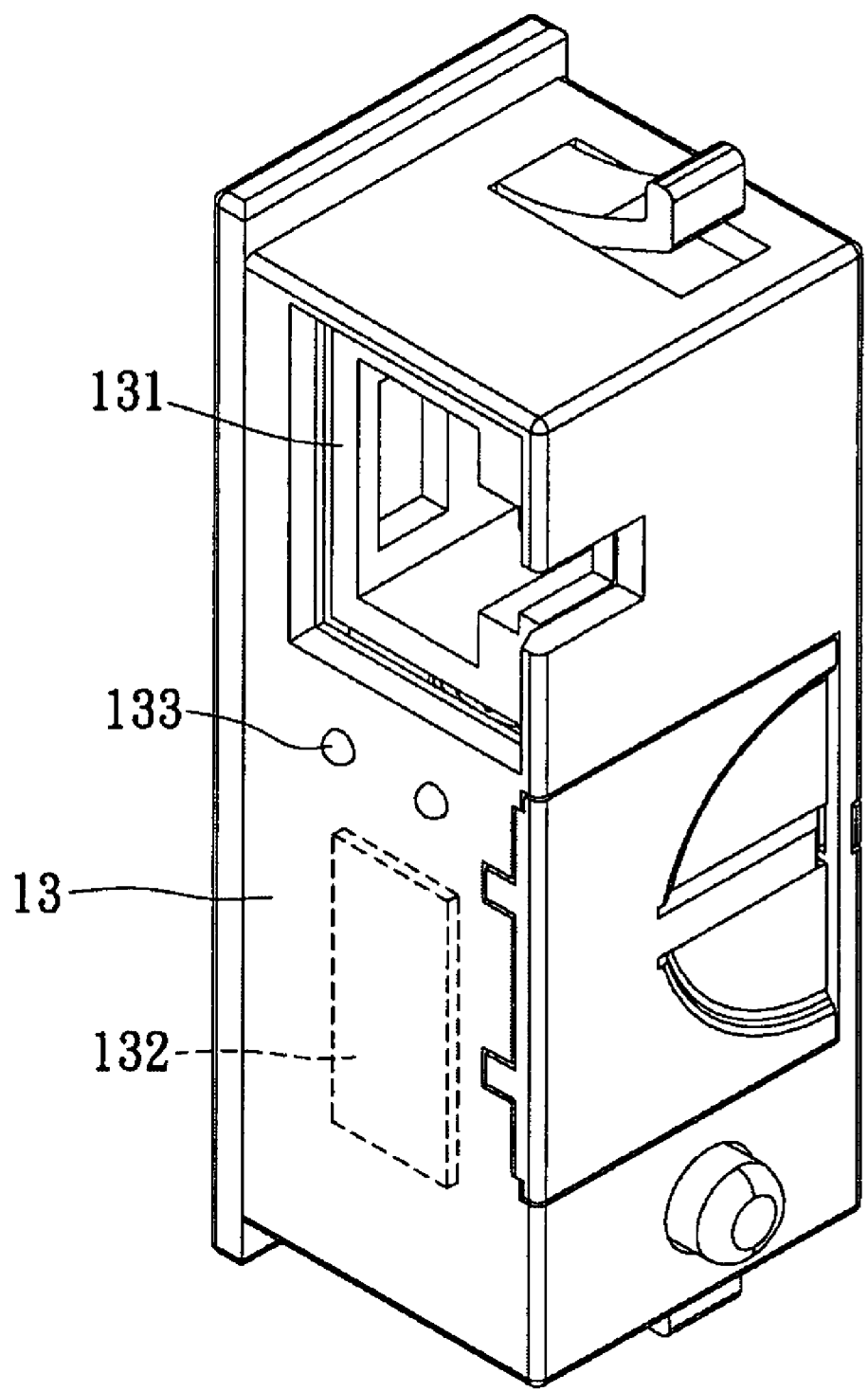
FIG. 3 is a perspective view showing a cable connector tester of the present invention.

Please refer to FIG. 3, specifically speaking; the cable connector tester 13 has at least one testing groove 131. The testing groove 131 is concavely located on the cable connector tester 13. Additionally, the cable connector tester 13 further has a printed circuit board 132 and at least one indicator 133. The printed circuit board 132 is invisibly disposed in the cable connector tester 13. The printed circuit board 132 can run a signal communication test via a test circuit (not shown in the figures). Therefore, the printed circuit board 132 is electrically connected with the testing groove 131; and signal connector 2 is electrically connected with the test circuit of the printed circuit board 132 via the testing groove 131. The determination of whether or not the signal connector 2 has been successfully crimped with the cable 3 may be done via the test circuit of the printed circuit board 132, wherein the test circuit tests the conduction between the signal connector 2 and the cable 3. Furthermore, the indicator 133 is electrically connected with the printed circuit board 132, the indicator 133 is for alerting the users, so as to quickly differentiate whether or not the signal connector 2 and the cable 3 are conductive, and thereby determine the success of the crimping. It is worthy to mention that the indicator 133 can be Light Emitting Diode (LED) with various colors or a buzzer with voice indication. Specifically speaking, the choice of the indicator 133 is decided according to users' requirements.

Figure 4:
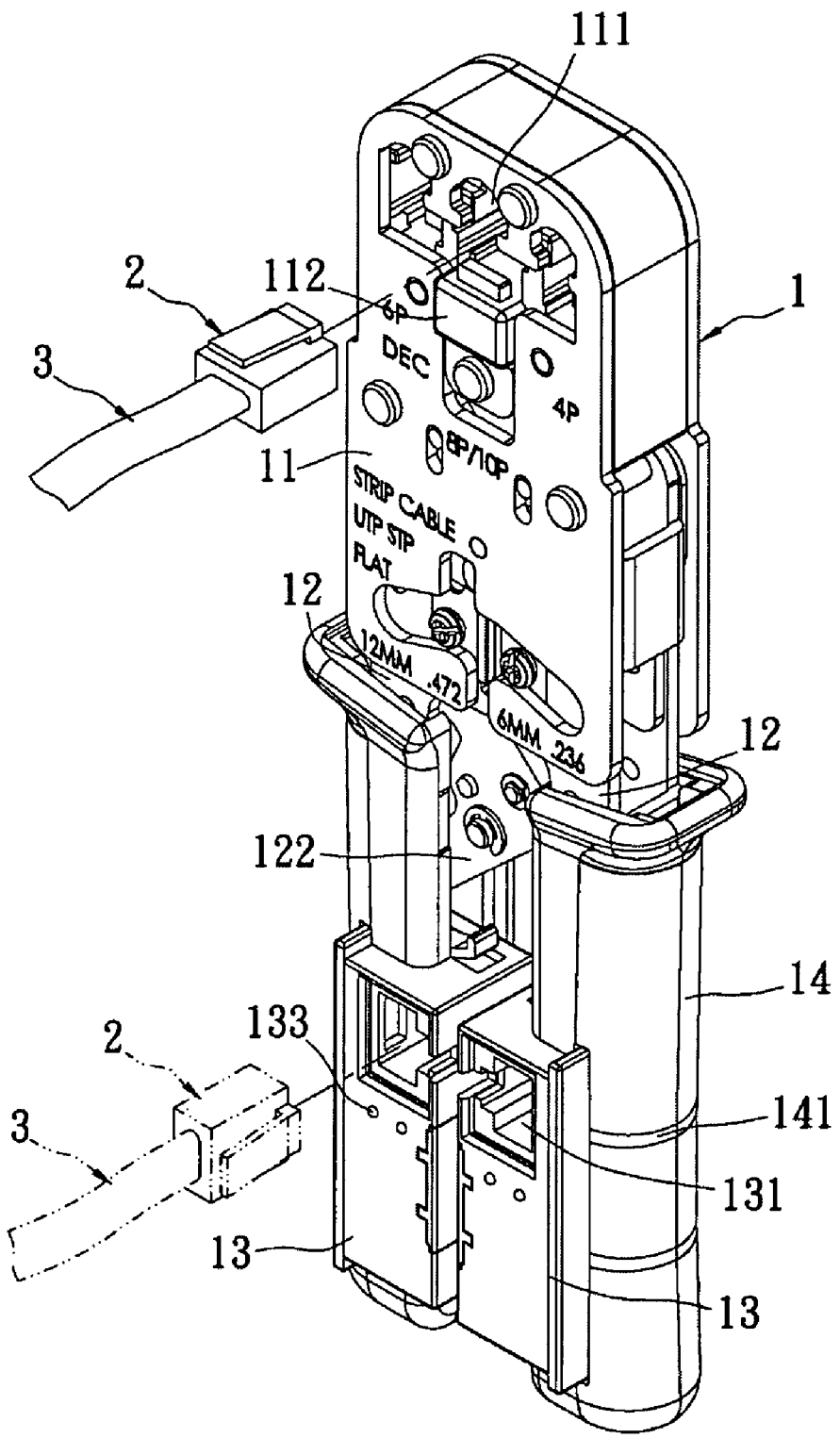
FIG. 4 is a schematic view showing an operating state of the crimping tool of the present invention.

Please refer to FIG. 4; construction workers use the crimping tool 1 to crimp the signal connector 2 and the cable 3 during construction. In other words, the signal connector 2 and the cable 3 are crimped via the crimping element 112 and the crimping groove 111 of the crimping tool 1. After crimping, the signal connector 2 may be inserted into the testing groove 131 of the cable connector tester 13 for testing the conduction of the signal connector 2 and the cable 3, so as to determine whether or not the crimping is successful.

In conclusion, the advantages of the present invention are as follows:

1. The crimping tool 1 can crimp and inspect the conduction of the signal connector 2, so that on-site construction works can distribute lines (wiring) quickly.

2. The on-site construction workers can detach the cable connector tester 13 from the crimping tool 1 or attach the cable connector tester 13 on the crimping tool 1, so that the on-site construction workers may only need to take the fewest number of tools necessary, yet still be able to use the crimping tool 1 to crimp and inspect, thereby increase the convenience of construction.

The above-mentioned descriptions represent merely the preferred embodiment of the present invention, without any intention to limit the scope of the present invention thereto. Various equivalent changes, alternations, or modifications based on the claims of present invention are all consequently viewed as being embraced by the scope of the present invention.

What is claimed is:

1. A crimping tool with detachable cable connector tester, comprising:
   a crimper body;
   two pressing handles, the two pressing handle each having one end movably connected to the crimper body, the other end of each pressing handles having at least one fastening groove, wherein the two pressing handles are for pressing, so as to drive the crimper body to crimp a signal connector with a cable; and
   at least one cable connector tester is detachably disposed in the fastening groove for testing the conduction between the signal connector and the cable.

2. The crimping tool with detachable cable connector tester as claimed in claim 1, wherein the crimper body has at least one crimping groove and at least one crimping element, the crimping groove is concavely located on the crimper body, the crimping element is movably disposed in the crimping groove, and the one end of each pressing handles is for pushing against the crimping element so as to crimp the cable and the signal connector.

3. The crimping tool with detachable cable connector tester as claimed in claim 1, wherein an elastic retaining element is connected between the two pressing handles, the elastic retaining element is for making the two pressing handles to open at a predetermined angle.

4. The crimping tool with detachable cable connector tester as claimed in claim 1, wherein at least one testing groove is concavely located on the cable connector tester for conduction test, the signal connector may be inserted into the testing groove for testing the conduction between the signal connector and the cable.

5. The crimping tool with detachable cable connector tester as claimed in claim 4, wherein the cable connector tester further has a printed circuit board and at least one indicator, the printed circuit board is invisibly disposed in the indicator and electrically connected with the testing groove, the indicator is disposed on the cable connector tester and electrically connected with the printed circuit board for indicating the status of the conduction between the signal connector and the cable.

6. The crimping tool with detachable cable connector tester as claimed in claim 5, wherein the indicator is Light Emitting Diode (LED).

7. The crimping tool with detachable cable connector tester as claimed in claim 5, wherein the indicator is a buzzer.

8. The crimping tool with detachable cable connector tester as claimed in claim 1, wherein the two pressing handles are respectively further covered with two non-skid cushions.

9. The crimping tool with detachable cable connector tester as claimed in claim 8, wherein the two non-skid cushions further has a plurality of non-skid patterns.

* * * * *